United States Patent
Ishizaki et al.

(10) Patent No.: US 7,105,911 B2
(45) Date of Patent: Sep. 12, 2006

(54) MULTILAYER ELECTRONIC SUBSTRATE, AND THE METHOD OF MANUFACTURING MULTILAYER ELECTRONIC SUBSTRATE

(75) Inventors: Koki Ishizaki, Hitachinaka (JP); Takeshi Shirato, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 42 days.

(21) Appl. No.: 10/684,812

(22) Filed: Oct. 15, 2003

(65) Prior Publication Data

US 2005/0087841 A1 Apr. 28, 2005

(30) Foreign Application Priority Data

Oct. 16, 2002 (JP) ............... 2002-302229

(51) Int. Cl.
*H01L 29/00* (2006.01)
(52) U.S. Cl. ................. 257/536; 257/758
(58) Field of Classification Search ............. 257/350, 257/358, 359, 360, 363, 379, 380, 528, 533, 257/536, 577, 581, 758; 338/198, 314
See application file for complete search history.

(56) References Cited

U.S. PATENT DOCUMENTS

| | | | |
|---|---|---|---|
| 3,786,557 A | 1/1974 | Bodway | |
| 4,792,779 A | 12/1988 | Pond et al. | |
| 5,557,252 A * | 9/1996 | Ariyoshi | 338/195 |
| 5,757,076 A * | 5/1998 | Kambara | 257/724 |
| 5,790,385 A * | 8/1998 | Tanimura | 361/766 |
| 6,144,287 A * | 11/2000 | Komeda | 338/195 |
| 6,304,167 B1 * | 10/2001 | Nakayama | 338/195 |
| 6,475,873 B1 | 11/2002 | Kalnitsky et al. | |
| 6,806,167 B1 * | 10/2004 | Kuriyama | 438/460 |
| 6,859,133 B1 * | 2/2005 | Nakanishi et al. | 338/309 |
| 2001/0003053 A1 | 6/2001 | Nagasaka | |
| 2003/0132828 A1 * | 7/2003 | Hashimoto et al. | 338/203 |
| 2004/0183155 A1 * | 9/2004 | Seto et al. | 257/529 |

FOREIGN PATENT DOCUMENTS

| | | |
|---|---|---|
| DE | 19548563 | 6/1997 |
| EP | 0324407 | 7/1989 |
| JP | 59-31412 | 2/1984 |
| JP | 61-65464 | 4/1986 |
| JP | 3-82194 | 4/1991 |
| JP | 3-254197 | 11/1991 |
| JP | 6-77665 | 3/1994 |
| JP | 2001-291603 | * 10/2001 |
| JP | 2002-237402 | * 8/2002 |

OTHER PUBLICATIONS

Corresponding European Search Report dated Feb. 8, 2006.
Japanese Office Action dated Mar. 8, 2006 with English translation.
English translation of Claim 1 in German publication No. DE 19548563.

* cited by examiner

*Primary Examiner*—S. V. Clark
(74) *Attorney, Agent, or Firm*—Crowell & Moring LLP (57) ABSTRACT

A multilayer electronic substrate is manufactured by employed: a first conductor layer arranged on an insulating substrate; an insulator arranged on the first conductor layer; a resistor arranged on the insulator; and second conductor layers for sandwiching the resistor to be connected to this resistor. In this multilayer electronic substrate, the resistor is trimmed so as to adjust an electric characteristic of a circuit, and a portion of the first conductor layer, which corresponds to a trimming portion of the resistor, is constituted by a first insulating region.

11 Claims, 8 Drawing Sheets

MULTILAYER ELECTRONIC SUBSTRATE, AND THE METHOD OF MANUFACTURING MULTILAYER ELECTRONIC SUBSTRATE

BACKGROUND OF THE INVENTION

1. Field of the Invention

The present invention generally relates to a multilayer electronic substrate which is employed in an electronic appliance. More specifically, the present invention is directed to a multilayer electronic substrate, a manufacturing method of the multilayer electronic substrate, and a use thereof, capable of easily performing a trimming step, while protecting an under-layer conductor when a resistor is trimmed, and also, capable of avoiding that a resistor is shortcircuited to an under-layer conductor layer by an electric conductive material of such a resistor which is melted during the trimming step.

2. Description of the Related Art

In a multilayer electronic substrate in which a resistor is trimmed so as to adjust an electric characteristic of a circuit, for example, a laser beam is irradiated to a resistor mounted on the multilayer electronic board so as to adjust a resistance value. When laser beams are irradiated to this resistor, if power of a laser beam is low, then a resistor element cannot be sufficiently cut, and thus high reliability cannot be obtained. Also, if power of a laser beam is excessively high, then there are some risks that an insulator is cut, and furthermore, a conductor (the ground) of an under layer of this insulator is cut. As explained above, the cutting depth of the insulator is adjusted by controlling the output power of the laser beams. Since the thickness of the insulator such as the multilayer electronic substrate is thin, it is practically difficult that the cutting depth is adjusted in the fine mode by controlling the power of the laser beams.

As a result, in a conventional trimming step, a heat-resisting surface layer portion is provided on a surface of an insulating layer of a position (under layer) which corresponds to such a portion of a multilayer electronic substrate, to which a laser beam is irradiated, so that it is possible to avoid that the laser beam is irradiated to a deep depth position of this multilayer electronic substrate. Thus, an under-layer conductor can be protected, and the trimming step can be carried out in an easy manner (refer to, for example, JP-A-6-77665 (Page 4, FIG. 1)).

In the trimming step described in, however, the following problems occur. That is, since the heat-resisting surface layer portion of the multilayer electronic substrate is provided, the thickness and the weight of the circuit are increased. Also, the material cost and the processing step number are increased.

SUMMARY OF THE INVENTION

An object of the present invention is to provide both a multilayer electronic substrate and a method of manufacturing the multilayer electronic substrate, capable of avoiding that while a resistor is trimmed so as to adjust an electric characteristic of a circuit, an electric conductive material of a melted resistor is reached to an under-layer conductor, which causes a shortcircuit between them.

Another object of the present invention is to provide both a multilayer electronic substrate and a method of manufacturing the multilayer electronic substrate, which do not conduct increases of a thickness and weight of the multilayer electronic substrate, but also do not cause both a material cost and a processing step number to be increased.

A further object of the present invention is to provide a multilayer electronic substrate and a method of manufacturing the multilayer electronic substrate, which can be made thin, in light weight, and in a low cost, while an under-layer conductor is protected and a trimming step can be easily carried out.

An aspect of the present invention is featured by such a multilayer electronic substrate manufactured by comprising: a first conductor layer arranged on an insulating substrate; an insulator arranged on the first conductor layer; a resistor arranged on the insulator; and a second conductor layer for sandwiching the resistor to be connected to the resistor; in which the resistor is trimmed so as to adjust an electric characteristic of a circuit; in which a portion of the first conductor layer, which corresponds to a trimming portion of the resistor, is constituted by an insulating region.

With employment of the above-described structure, according to the present invention, while the laser beam is irradiated to the resistor so as to trim this resistor by which the electric characteristic of the circuit is adjusted, the under layer of the insulator at the position (under layer) corresponding to the portion where the laser beam is irradiated is constituted by the insulating region, and no conductor is arranged in the under layer. As a result, even when the cutting depth cannot be firmly adjusted by controlling the power of the laser beam, but also the cutting depth is increased by irradiating the laser beam, there is no risk that the conductor of the under layer is cut by irradiating the laser beam:

Also, in accordance with the present invention, since the under layer of the insulator at the position (under layer) corresponding to the portion where the laser beam is irradiated is constituted by the insulating region, and no conductor is arranged in the under layer, when the resistor is trimmed so as to adjust the electric characteristic of the circuit, it is possible to avoid that the electric conductive material of the melted resistor is reached to the under-layer conductor, which causes an occurrence of a shortcircuit between them.

Another aspect of the present invention is featured by that a multilayer electronic substrate is manufactured by executing such a manufacturing method comprising: a first step for arranging a first conductor layer on an insulating substrate; a second step for forming a gap in the first conductor layer; a third step for arranging an insulator on the first conductor layer and in the gap; a fourth step for arranging a resistor on the insulator, and a second conductor layer which sandwiches the resistor and is connected to the resistor; and a fifth step for trimming the resistor so as to adjust an electric characteristic of a circuit and to form a trimming portion.

With employment of the above-described structure, according to the present invention, while the laser beam is irradiated to the resistor so as to trim this resistor by which the electric characteristic of the circuit is adjusted, the under layer of the insulator at the position (under layer) corresponding to the portion where the laser beam is irradiated is constituted by the insulating region, and no conductor is arranged in the under layer. As a result, even when the cutting depth cannot be firmly adjusted by controlling the power of the laser beam, but also the cutting depth is increased by irradiating the laser beam, it is possible to manufacture such a multilayer electronic substrate capable of avoiding that the conductor of the under layer is cut by irradiating the laser beam.

Also, in accordance with the present invention, since the under layer of the insulator at the position (under layer) corresponding to the portion where the laser beam is irradiated is constituted by the insulating region, and no conductor is arranged in the under layer, such a multilayer electronic substrate can be manufactured in such a manner that when the resistor is trimmed so as to adjust the electric characteristic of the circuit, it is possible to avoid that the electric conductive material of the melted resistor is reached to the under-layer conductor, which causes an occurrence of a shortcircuit between them.

Other aspects of the present invention will be described in the below-mentioned embodiment in conjunction with the accompanying drawings.

DESCRIPTION OF THE EMBODIMENTS

The present invention corresponds to a multilayer electronic substrate manufactured by comprising: a first conductor layer arranged on an insulating substrate; an insulator arranged on the first conductor layer; a resistor arranged on the insulator; and a second conductor layer for sandwiching the resistor to be connected to the resistor; in which the resistor is trimmed so as to adjust an electric characteristic of a circuit; in which a portion of the first conductor layer, which corresponds to a trimming portion of the resistor, is constituted by an insulating region.

Also, the present invention corresponds to such a multilayer electronic substrate that the portion of the first conductor layer, which corresponds to the trimming portion of the resistor, is formed by a mask pattern printing operation when the first conductor layer is printed.

Also, the present invention corresponds to such a multilayer electronic substrate that the portion of the first conductor layer, which corresponds to the trimming portion of the resistor, is formed by a trimming operation after the first conductor layer has been printed in a solid manner.

Also, the present invention corresponds to such a multilayer electronic substrate that the insulating region is formed in an integral body with the insulator arranged between the first conductor layer and the second conductor layer.

Also, the present invention corresponds to such a multilayer electronic substrate that the insulating region is separately formed with reference to the insulator arranged between the first conductor layer and the second conductor layer, and is inserted to be arranged.

Also, the present invention corresponds to such a multilayer electronic substrate that a circuit pattern protection layer is provided in such a manner that the circuit pattern protection layer covers the insulator, the second conductor layer, and the resistor.

Also, the present invention corresponds to such an electronic appliance containing: a multilayer electronic substrate as a structural component, which is manufactured by comprising: a first conductor layer arranged by providing an insulating region on an insulating substrate; an insulator arranged by embedding the insulating region on the first conductor layer; and a resistor arranged on the insulator, and a second conductor layer for sandwiching the resistor to be connected to the resistor; and in which the resistor is trimmed so as to adjust an electric characteristic of a circuit.

Also, the present invention is featured by that the multilayer electronic substrate is employed in a heat wire type airflow meter for measuring a flow rate of air by controlling a current flowing through a heat wire.

Also, the present invention is featured by manufacturing such a multilayer electronic substrate by executing: a first step for arranging a first conductor layer on an insulating substrate; a second step for forming a gap in the first conductor layer; a third step for arranging an insulator on the first conductor layer and in the gap; a fourth step for arranging a resistor on the insulator, and a second conductor layer which sandwiches the resistor and is connected to the resistor; and a fifth step for trimming the resistor so as to adjust an electric characteristic of a circuit and to form a trimming portion.

Also, the present invention is featured by that the gap to be formed in the first conductor layer is formed by mask pattern printing operation when the first conductor layer is printed.

Also, the present invention is featured by that the gap to be formed in the first conductor layer is formed by a trimming operation after the first conductor layer has been printed.

Also, the present invention is featured by that after trimming said resistor so as to adjust the electric characteristic of the circuit and to form the trimming portion, is provided in which a circuit pattern protection layer is arranged on the first insulator, the resistor, and the second conductor layer.

Also, the present invention corresponds to such a multilayer electronic substrate manufactured by comprising: a first conductor layer arranged on an insulating substrate; a first insulator arranged on the first conductor layer; a first resistor arranged on the first insulator; a second conductor layer for sandwiching the first resistor to be connected to the first resistor; a second insulator arranged on the first insulator, the first resistor, and the second conductor; a second resistor arranged on the second insulator, and a third conductor for sandwiching the second resistor to be connected to the second resistor; and a circuit pattern protection layer arranged on the second insulator, the third conductor, and the second resistor; in which the first resistor is trimmed so as to adjust an electric characteristic of a circuit and the second resistor is trimmed so as to adjust an electric characteristic of a circuit; a portion of the first conductor layer, which corresponds to a first trimming portion of the first resistor, is constituted by a first insulating region; and a portion of the first conductor layer, which corresponds to a second trimming portion of the second resistor, is constituted by a second insulating region.

Also, the present invention is featured by that both the portion of the first conductor layer, which corresponds to the first trimming portion of the first resistor, and the portion of the second conductor layer, which corresponds to the second trimming portion of the second resistor, are formed by a mask pattern printing operation when the first conductor layer is printed.

Also, the present invention is featured by that both the portion of the first conductor layer, which corresponds to the first trimming portion of the first resistor, and the portion of the second conductor layer, which corresponds to the second trimming portion of the second resistor, are formed by a trimming operation after the first conductor layer has been printed in a solid printing manner.

Also, the present invention is featured by that both the first insulating region and the second insulating region are formed in an integral body with the insulator arranged between the first conductor layer and the second conductor layer.

Also, the present invention is featured by that both the first insulating region and the second insulating region are separately formed with reference to the insulator arranged between the first conductor layer and the second conductor layer.

Also, the present invention is featured by that such a multilayer electronic substrate is employed in a structural component of an electronic appliance, and is manufactured by comprising: a first conductor layer arranged on an insulating substrate; a first insulator arranged on the first conductor layer; a first resistor arranged on the first insulator; a second conductor layer for sandwiching the first resistor to be connected to the first resistor; a second insulator arranged on the first insulator, the first resistor, and the second conductor; a second resistor arranged on the second insulator, and a third conductor for sandwiching the second resistor to be connected to the second resistor; and a circuit pattern protection layer arranged on the second insulator, the third conductor, and the second resistor; in which the first resistor is trimmed so as to adjust an electric characteristic of a circuit and the second resistor is trimmed so as to adjust an electric characteristic of a circuit; and both the first resistor and the second resistor are trimmed in order to adjust an electric characteristic of a circuit.

Also, the present invention is featured by that the multilayer electronic substrate is employed in a heat wire type airflow meter for measuring a flow rate of air by controlling a current which flows though a heat wire.

Also, the present invention is featured by manufacturing a multilayer electronic substrate by executing: a first step for arranging a first conductor layer on an insulating substrate; a second step for forming a first gap and a second gap in the first conductor layer; a third step for arranging a first insulator on the first conductor layer and in the first gap and the second gap; a fourth step for arranging a first resistor on the first insulator, and a second conductor layer which sandwiches the first resistor and is connected to the first resistor; a fifth step for trimming the first resistor so as to adjust an electric characteristic of a circuit and to form a trimming portion; a sixth step for arranging a second insulator on the second conductor layer, a seventh step for arranging second resistor on the second insulator, and a third conductor which sandwiches the second resistor and is connected to the second resistor; and an eighth step for trimming the second resistor so as to adjust an electric characteristic of a circuit and to form a trimming portion.

Also, the present invention is featured by that both the first gap and the second gap are formed in the first conductor layer by a mask pattern printing operation when the first conductor layer is printed.

Also, the present invention is featured by that both the first gap and the second gap are formed in the first conductor layer by a trimming operation after the first conductor layer has been printed in a solid step in the first step.

Further, the present invention is featured by that the multilayer electronic substrate is manufactured by in such a manner that after trimming the second resistor as to adjust the electric characteristic of the circuit and to form the trimming portion, a step is provided in which a circuit pattern protection layer is arranged on the first insulator, the second resistor, and the third conductor.

A multilayer electronic substrate of the present invention is utilized in electronic industries such as commercially-available appliances and computers. This multilayer electronic substrate is such a high density multilayer electronic substrate that a low resistance conductor (ground layer) is wired in a solid manner on a ceramic substrate, an insulating layer is printed thereon, a conductor is printed thereon, and a thin-film resistance conductor having a high precision electric characteristic is printed on a surface of this multilayer electronic substrate. As the multilayer electronic substrate according to the present invention, a description is made of such an example that this multilayer electronic substrate is applied to an electronic circuit provided in a heat wire type airflow meter.

Figure 1:
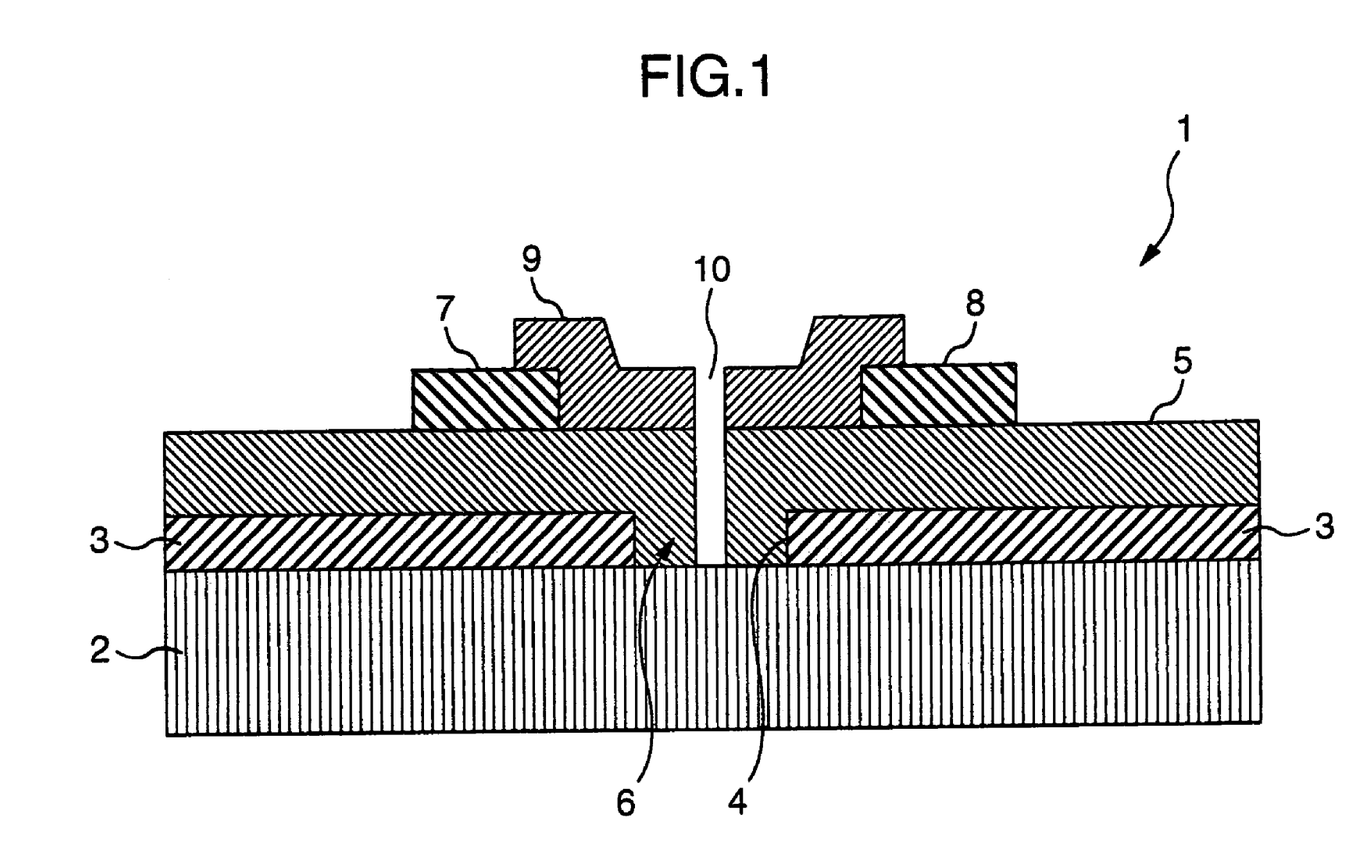
FIG. 1 is a structural sectional view of a multilayer electronic substrate which shows a first embodiment of the multilayer electronic substrate employed in a heat wire type airflow meter to which the present invention is applied.
Figure 2:
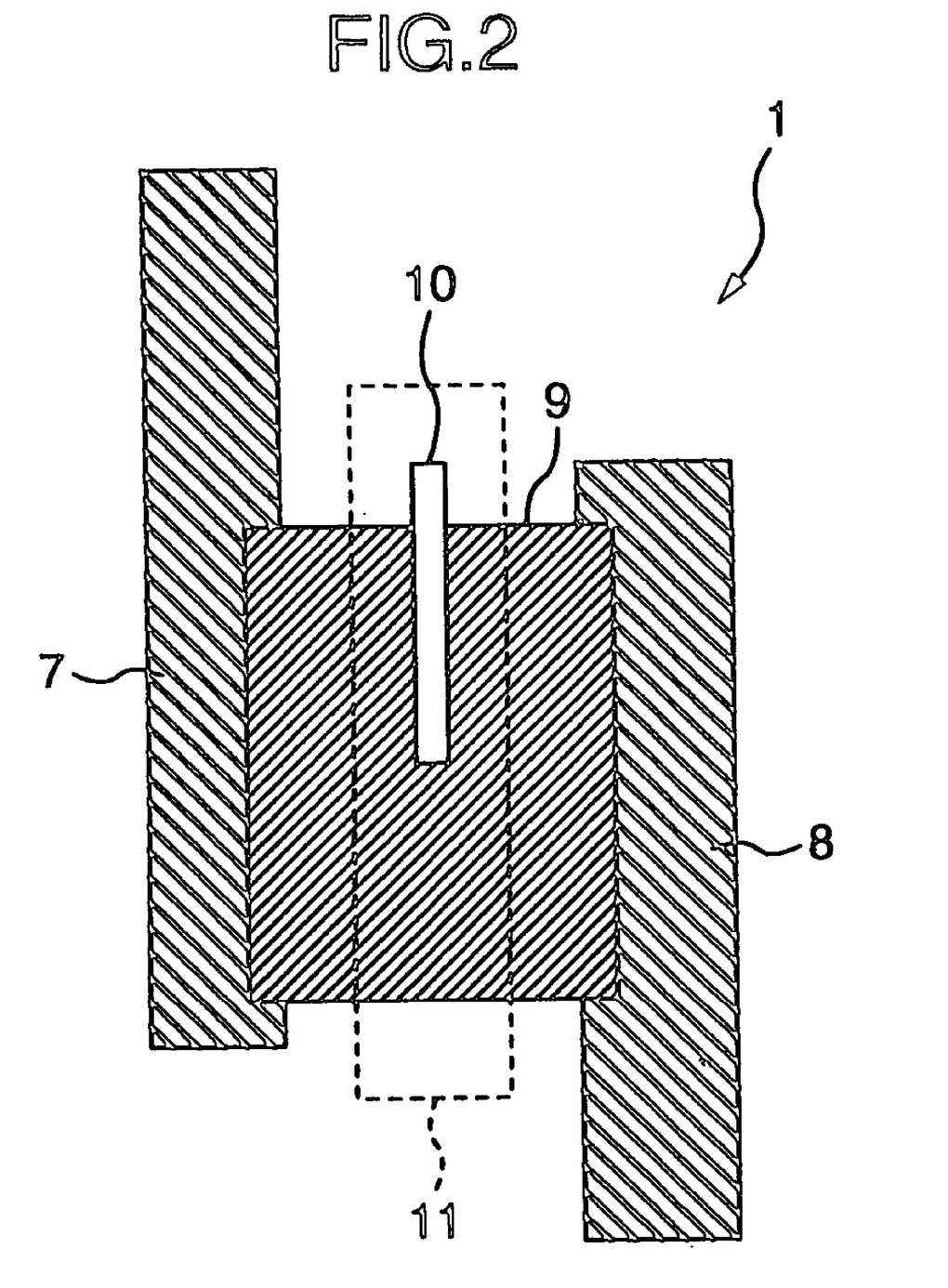
FIG. 2 is a plan view for indicating the multilayer electronic substrate shown in FIG. 1.

FIG. 1 shows a structural sectional view of a multilayer electronic substrate, according to a first embodiment of the present invention, employed in a heat wire type airflow meter. FIG. 2 is a plan view for indicating the multilayer electronic substrate shown in FIG. 1.

The multilayer electronic substrate 1 owns such a structure as shown in FIG. 1 and FIG. 2. That is to say, in FIG. 1 and FIG. 2, a first conductor layer 3 is formed on an insulating substrate 2. This insulating substrate 2 is constructed of, for example, alumina ceramics. Then, the first conductor layer 3 formed on this insulating substrate 2 is adhered on the insulating substrate 2 in a solid manner, which constitute a ground layer (solid-adhered ground). As to this ground layer, the larger the area of this ground layer becomes, the higher shielding effects for electromagnetic noise propagated from an external noise source can be obtained more effectively. The first conductor layer 3 is formed by a printing step. A gap 4 is formed in this first conductor layer 3 by partially removing the first conductor layer 3 in a predetermined width. This gap 4 is formed by executing a method by which when the first conductor layer 3 is printed, the first conductor layer 3 is previously removed by a mask pattern printing operation, or by performing another method in which the first conductor layer 3 is printed in a solid manner (namely, print without masking), and thereafter, the resultant first conductor layer 3 is trimmed (for example, sand trimming and laser trimming).

Also, an area of this gap 4 must be made small as being permitted as possible due to the shielding characteristic of the electromagnetic noise as the ground layer. To this end, while considering a width of a laser beam when a trimming operation is carried out, a fluctuation of a laser beam width which is set, printing precision of the first conductor layer 3, and the like, the width of the gap 4 where the under layer conductor is not previously arranged is set to, for example, on the order of 600 microns.

An insulator 5 having a predetermined thickness is stacked on the first conductor layer 3 in which the gap 4 has been formed by this laser trimming operation. Then, this insulator 5 is made of, for instance, insulating glass. A thickness of the insulator 5 to be stacked is selected to be on the order of 20 to 100 microns. Alternatively, this insulator 5 is formed by employing two, or more layers of the insulating glass in order to secure the insulating characteristic thereof. When this insulator 5 is stacked on the first conductor layer 3, it is apparent that the insulator 5 is stacked on the first conductor layer 3, and also, this insulator 5 is filled into the gap 4 which has been formed in the first conductor layer 3. Since this insulator 5 is filled, a first insulating region 6 is formed in this gap 4. This first insulating region 6 corresponds to a conductor-layer-removed area 11 shown in FIG. 2.

In this embodiment, as the insulator which is filled into the gap 4 (namely, conductor-layer-removed area 11) where this first insulating area 6, the insulator 5 stacked on the first conductor layer 3 has been filled into this gap 4. Alternatively, the insulator of the first insulating area 6 may not be made by employing the same insulating material as that of the insulator 5, but may be alternatively formed by using a different sort of insulating material as that of this insulator 5. Even when the same insulating material as that of the insulator 5 is filled which is stacked on the first conductor layer 3 as explained in this embodiment, there are two different cases. That is, in one case, the same insulating material is printed/formed at the same time when the insulator 5 is formed in the printing step. In the other case, the same insulating material is printed/formed in a different printing step from the printing step of the insulator 5.

Two second conductor layers 7 and 8 are formed on this insulator 5, while these second conductor layers 7 and 8 are separated from each other by a predetermined width. These two second conductor layers 7 and 8 are formed on the insulator 5 by a printing step. Then, a resistor 9 is formed in such a manner that this resistor 9 connects these two second conductor layers 7 and 8. Similar to the second conductor layers 7 and 8, this resistor 9 is formed on the insulator 5 by a printing step. The predetermined width formed between the second conductor layer 7 and the second conductor layer 8 is formed by a mask in the printing step during which the second conductor layers 7 and 8 are printed on the insulator 5. As to the arranging position of this resistor 9, the resistor 9 is located at a position above the gap 4 which is formed on the first conductor layer 3 by a laser trimming operation.

In order to adjust an electric characteristic of a circuit of the multilayer electronic substrate 1 which has been formed in this manner, the resistor 9 arranged on the surface of the multilayer electronic substrate 1 is trimmed by using a laser beam. Since this resistor 9 is trimmed, a first trimming portion (namely, groove formed by trimming operation) 10 is formed in the multilayer electronic substrate 1. While this resistor 9 is trimmed, the laser beam is irradiated from the surface of the resistor 9. A trimming depth formed by the laser beam is selected to be, for example, on the order of 20 microns per 1 irradiation of the laser beam. As to this laser beam irradiation, the laser beam may be irradiated to the same place plural times, depending upon an adjusting manner of an electric characteristic of this circuit. Thus, there are some possibilities that the trimming portion (groove formed by trimming operation) 10 is reached to the surface layer of the insulating substrate 2.

As a consequence, in the first embodiment of the multilayer electronic substrate 1 shown in FIG. 1 and FIG. 2, the conductor portion of the first conductor layer 3, which corresponds to the first trimming portion 10, is removed so as to form the gap 4. Then, the insulator 5 is filled into this gap 4 so as to construct the first insulating region 6, so that it is possible to avoid an adverse influence given to the first conductor layer 3 when the laser beam is irradiated. In FIG. 2, this first insulating region 6 is represented as the conductor-layer-removed area 11 from which the first conductor layer 3 located in the vicinity of the first trimming portion (groove formed by trimming operation) has been removed.

Figure 8:
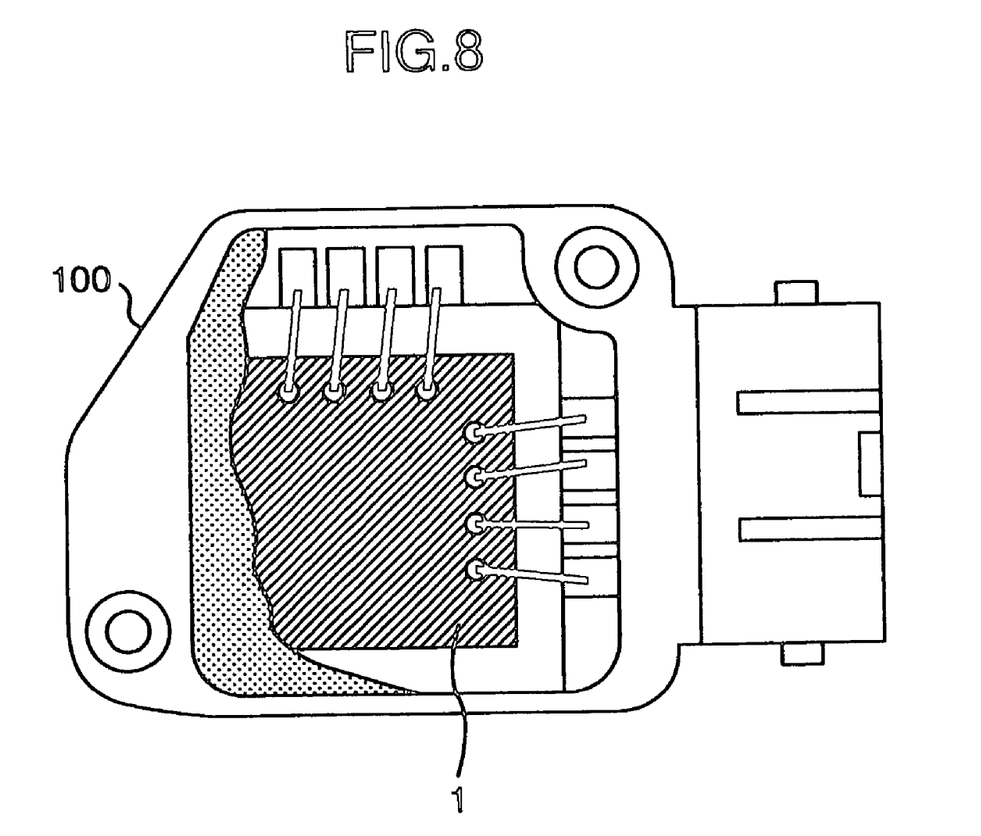
FIG. 8 is a diagram for indicating an example in which when a multilayer circuit substrate according to the present invention is employed in a heat wire type airflow meter, this multilayer circuit substrate is mounted on the heat wire type airflow meter.

FIG. 8 shows such a condition that this multilayer electronic substrate 1 is applied to an electronic circuit employed in a heat wire type airflow meter 100. In FIG. 8, the multilayer electronic substrate 1 is stored inside the heat wire type airflow meter 100. In this drawing, such an example is shown. That is, the multilayer electronic substrate 1 indicated in FIG. 1 is applied to the electronic circuit employed in the heat wire type airflow meter 100, but the present invention is not limited to this example. Apparently, the multilayer electronic substrate 1 may also be applied to other products utilizing electronic circuits. For instance, the multilayer electronic substrate 1 shown in FIG. 1 may be alternatively applied to an electronic circuit used in a pressure sensor, an electronic circuit of an engine control unit of an automobile, and the like.

FIGS. 3A–3F indicate a method for manufacturing the multilayer electronic substrate 1 shown in FIG. 1, according to a first embodiment.

Figure 3A:
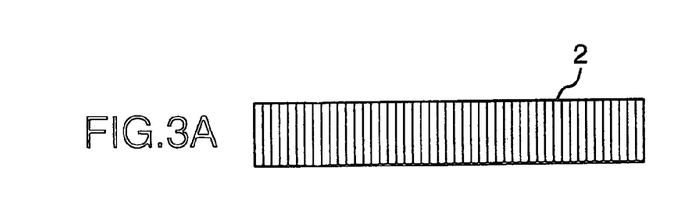
FIGS. 3A–3F are manufacturing step diagrams for indicating a method of manufacturing the multilayer electronic substrate shown in FIG. 1, according to a first embodiment of the present invention.
Figure 3B:
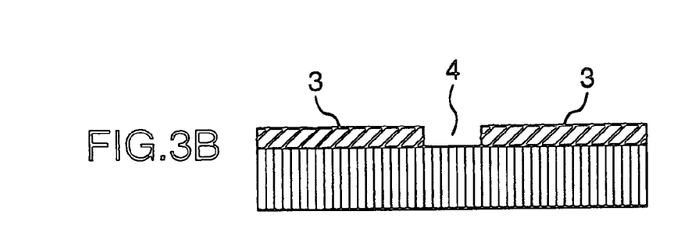

First, in FIG. 3A, an insulating substrate 2 is set which is formed by, for example, alumina ceramics. Next, in FIG. 3B, a first conductor layer 3 is arranged on the insulating substrate 2. This first conductor layer 3 is formed in a printing step, and the first conductor layer 3 is adhered on one plane (namely, upper plane shown in this drawing) of the insulating substrate 2 in a solid manner, so that a solid-adhered ground layer is formed. When the first conductor layer 3 is arranged (stacked) on this insulating substrate 2, a gap 4 is formed in the first conductor layer 3 from which the first conductor layer 3 has been partially removed in a predetermined width. This gap 4 having a width of approximately 600 microns is formed by executing such a method that when the first conductor layer 3 is printed, a portion of the first conductor layer 3 which has been previously removed is masked.

Figure 3C:
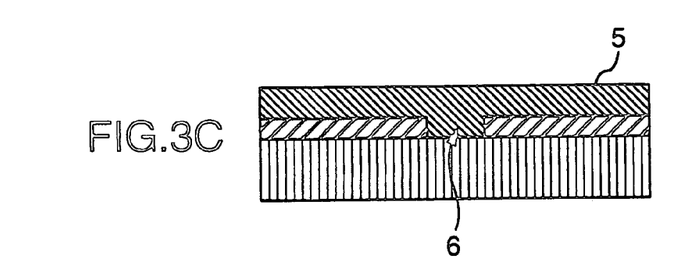

When the gap 4 is formed in this first conductor layer 3, in FIG. 3C, an insulator 5 which has a width of on the order of 20 to 100 microns and is constructed of, for example, insulating glass is formed on the first conductor layer 3 by way of a printing step. Since the insulator 5 is arranged (stacked) on this first conductor layer 3, the insulator 5 is also filled into the gap 4, and thus, a first insulating region 6. The insulator (namely, insulator filled into gap 4) of this first insulating region 6 may be made of the same material as that of the insulator 5, or may be alternatively made of a different sort of material from that of the insulator 5. In such a case that this insulator is made of the different sort of material from that of the insulator 5, after the gap 4 has been formed in the first conductor layer 3 in FIG. 3B, the different sort of material from that of the insulator 5 is filled into this gap 4. Thereafter, the insulator 5 is formed on the first conductor layer 3.

Figure 3D:
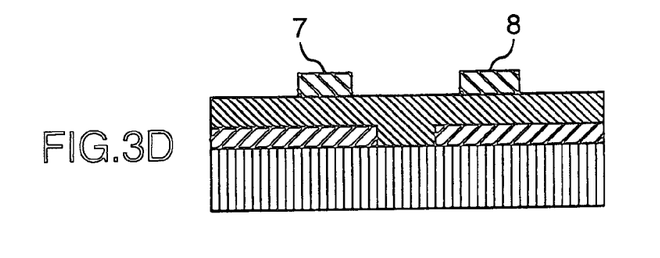

When the insulator 5 is formed on the first conductor 3 and the insulator 5 is also filled into the gap 4 so as to form the first insulating portion 6 in the above-described manner, in FIG. 3D, two pieces of second conductor layers 7 and 8 are formed on the insulator 5 by way of a printing step, while these second conductor layers 7 and 8 are separated from each other by a predetermined width. The predetermined width to be formed between the second conductor layer 7 and the second conductor layer 8 is formed by a mask when both the second conductor layer 7 and 8 are printed on the insulator 5.

Figure 3E:
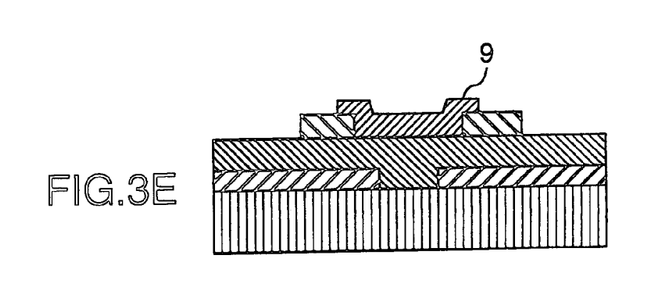

When the two second conductor layers 7 and 8 are formed on this insulator 5 in such a manner that these second conductor layers 7 and 8 are separated from each other by the predetermined width, in FIG. 3E, a resistor 9 is formed on the insulator 5 by way of a printing step, while this resistor 9 is connected to the two second conductor layers 7 and 8. If the resistor 9 is formed in such a manner, then the two second conductor layers 7 and 8 are arranged in such a manner that while sandwiching this resistor 9, these second conductor layers 7 and 8 are connected to this resistor 9. The resistor 9 arranged in this manner may be formed at a position on the first conductor layer 3, corresponding to an upper portion of the gap 4 formed by the laser trimming operation.

Figure 3F:
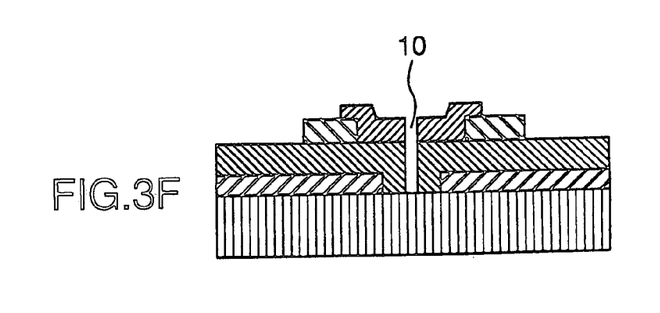
Figure 4A:
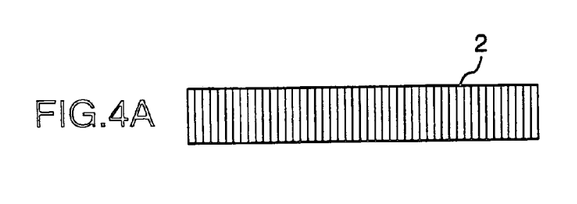
FIGS. 4A–4G are manufacturing step diagrams for indicating a method of manufacturing the multilayer electronic substrate shown in FIG. 1, according to a second embodiment of the present invention.
Figure 4B:
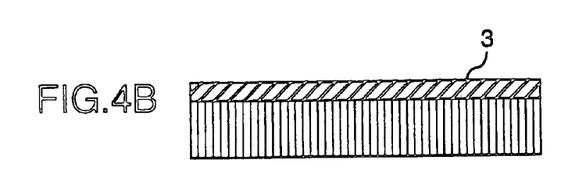
Figure 4C:
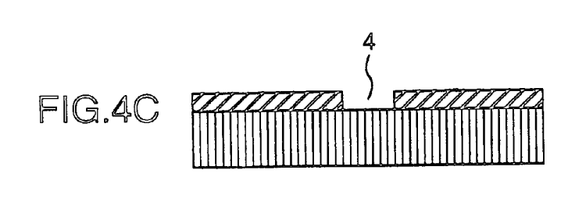
Figure 4D:
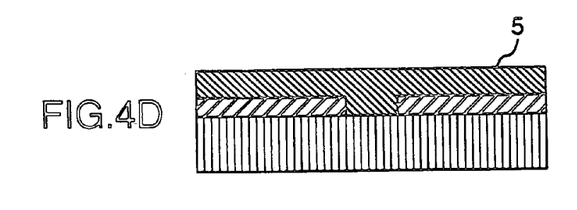
Figure 4E:
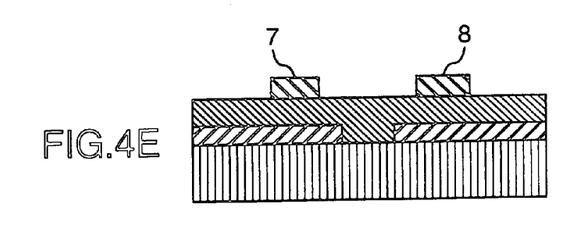
Figure 4F:
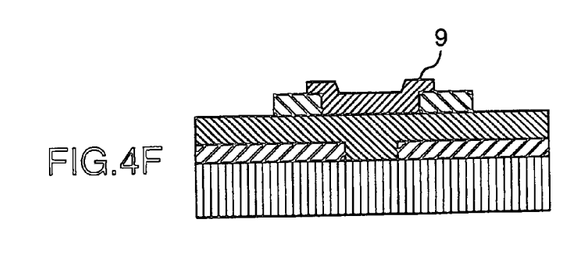
Figure 4G:
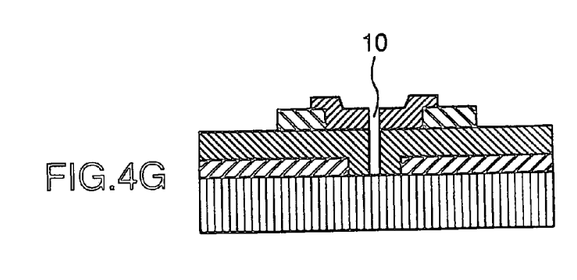

When the resistor 9 is arranged on this insulator 5 while this resistor 9 is connected to the second conductor layers 7 and 8, in FIG. 3F, the resistor 9 is trimmed so as to adjust the electric characteristic of the circuit, and then, a first trimming portion 10 is fabricated. When this resistor 9 is trimmed, a trimming depth is defined by, for example, on the order of 20 microns per one irradiation of the laser beam.

As a consequence, in the manufacturing method of the multilayer electronic substrate 1 shown in FIG. 3, according to the first embodiment, the first conductor layer 3 of the portions of the second conductor layers 7 and 8, which correspond to the first trimming portion 10, is removed so as to form the gap 4. Then, the insulator 5 is filled into this gap 4, so that the multilayer electronic substrate which constitutes the first insulating region 6 can be manufactured, and the adverse influence given to the first conductor layer 3 when the laser beam is irradiated can be avoided.

FIGS. 4A–4G indicate a method of manufacturing the multilayer electronic substrate 1 shown in FIG. 1, according to a second embodiment.

The second embodiment of the manufacturing method for the multilayer electronic substrate 1, shown in FIGS. 4A–4G, has such a technical point different from the first embodiment of the manufacturing method for the multilayer electronic substrate, indicated in FIGS. 3A–3F. That is, in the first embodiment of the manufacturing method for the multilayer electronic substrate, as shown in FIGS. 3A–3F, the insulating substrate 2 made of alumina ceramics is set, and in the case the first conductor layer 3 is formed on the insulating substrate 2, when the first conductor layer 3 is printed, the gap 4 is masked to be formed which previously removes the first conductor layer 3 by way of the mask pattern printing operation. In contrast to this first embodiment, the second embodiment of the manufacturing method for the multilayer electronic substrate as shown in FIGS. 4A–4G is featured as follows. That is, the insulating substrate 2 made of alumina ceramics is set, and in the case that the first conductor layer 3 is formed on the insulating substrate 2, after the first conductor layer 3 has been printed in a solid manner (namely, printed without masking), a gap 4 is formed from which the first conductor layer 3 is removed by way of a trimming operation (for example, sand trimming and laser trimming operations). As to other technical points, FIG. 3C corresponds to FIG. 4D; FIG. 3D corresponds to FIG. 4E; FIG. 3E corresponds to FIG. 4F; and FIG. 3F corresponds to FIG. 4G.

As a consequence, the second embodiment of the manufacturing method for the multilayer electronic substrate represented in FIGS. 4A–4G, may also achieve a similar effect with respect to that achieved by the first embodiment of the manufacturing method for the multilayer electronic substrate shown in FIGS. 3A–3F.

Figure 5:
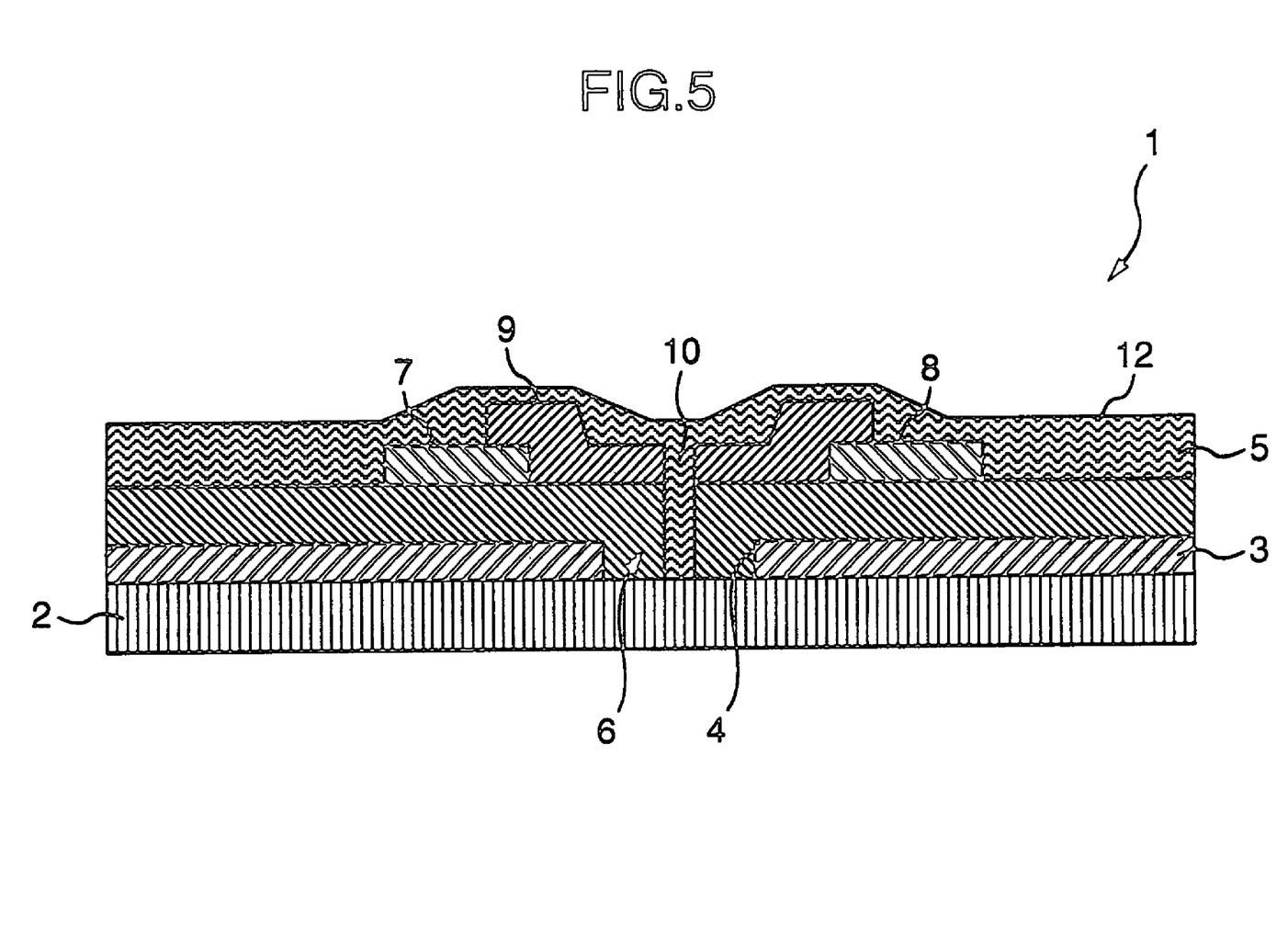
FIG. 5 is a structural sectional view of a multilayer electronic substrate which shows a second embodiment of the multilayer electronic substrate employed in a heat wire type airflow meter to which the present invention is applied.

FIG. 5 is a structural sectional view of a multilayer electronic substrate employed in a heat wire type airflow meter, according to a second embodiment of the present invention.

The second embodiment of the multilayer electronic substrate shown in FIG. 5 owns a technical difficult point from the first embodiment of the multilayer electronic substrate indicated in FIG. 1. That is, in the first embodiment of the multilayer electronic substrate 1 shown in FIG. 1, both the resistor 9, and the second conductor layers 7 and 8 are formed on the insulator 5, while these second conductor layers 7 and 8 sandwich this resistor 9 and are arranged to be connected to this resistor 9. Then, the resistor 9 is trimmed so as to adjust the electric characteristic of the circuit, and the first trimming portion 10 is formed, so that the multilayer electronic substrate 1 is constituted. In contrast thereto, in the second embodiment of the multilayer electronic substrate shown in FIG. 5, a resistor 9 is trimmed so as to adjust an electric characteristic of a circuit and a first trimming portion 10 is formed. Thereafter, a circuit pattern protection layer 12 is formed on a first insulator 5, a first resistor 9, and also second conductor layers 7 and 8.

As a consequence, the second embodiment of the multilayer electronic substrate represented in FIG. 5 may also achieve a similar effect with respect to that achieved by the first embodiment of the multilayer electronic substrate, shown in FIG. 1.

Figure 6:
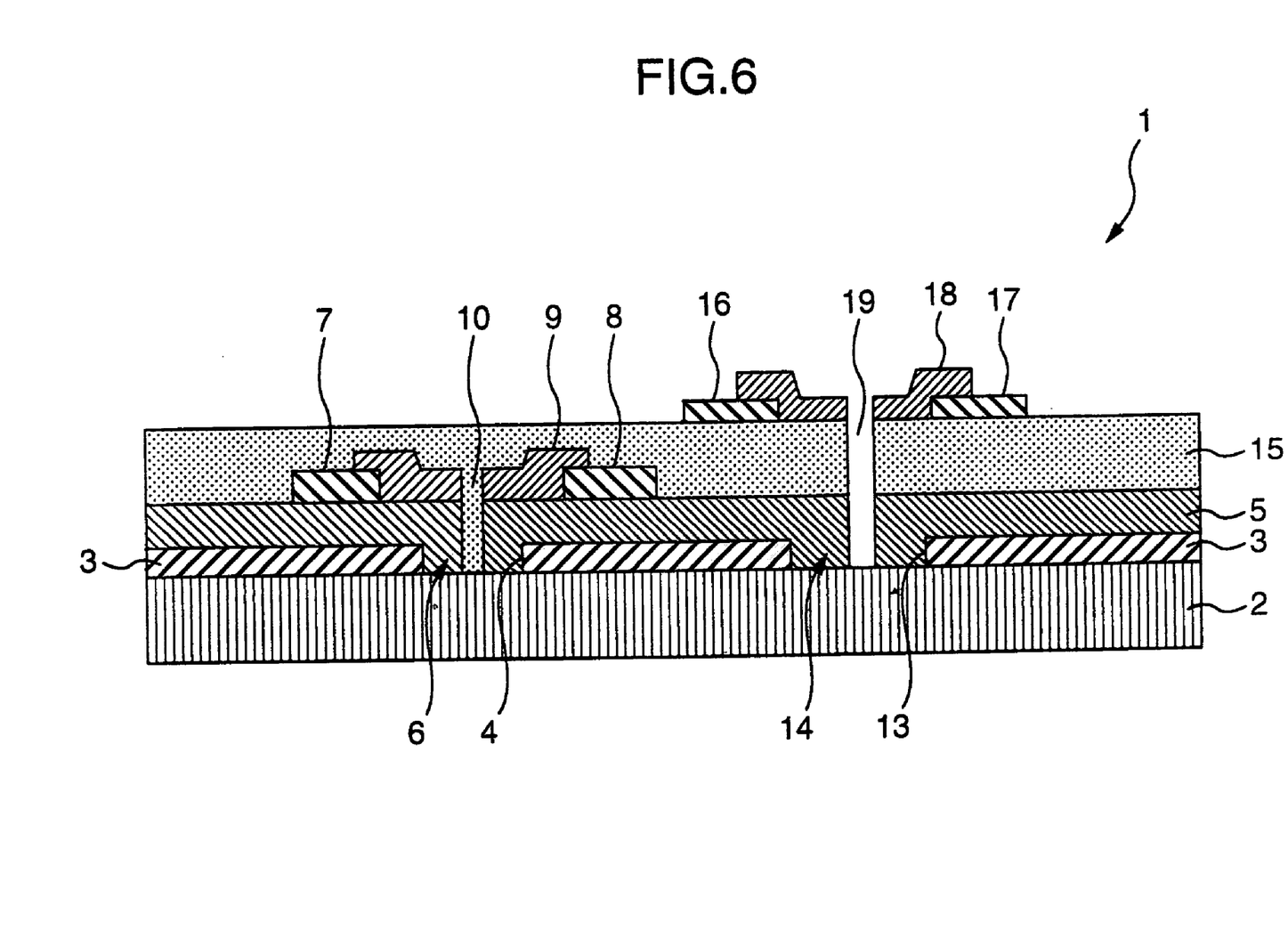
FIG. 6 is a structural sectional view of a multilayer electronic substrate which shows a third embodiment of the multilayer electronic substrate employed in a heat wire type airflow meter to which the present invention is applied.

FIG. 6 is a structural sectional view of a multilayer electronic substrate employed in a heat wire type airflow meter, according to a third embodiment of the present invention.

The third embodiment of the multilayer electronic substrate shown in FIG. 6 owns a technical difficult point from the first embodiment of the multilayer electronic substrate indicated in FIG. 1. That is, the first embodiment of the multilayer electronic substrate shown in FIG. 1 corresponds to such an example that the conductors which form the two second conductor layers 7 and 8 on the upper layer of the first conductor layer 3 are made of 2 layers. In contrast thereto, the third embodiment of the multilayer electronic substrate shown in FIG. 6 owns such a technical different point that conductors which further form two second conductors on two second conductor layers 7 and 8 are made of three layers.

In other words, in FIG. 6, while a first conductor layer 3 is formed on an insulating substrate 2, two gaps 4 and 13 are formed in this first conductor layer 3 from which the first conductor layer 3 having a predetermined width has been partially removed. Then, a first insulator 5 having a predetermined thickness is stacked on the first conductor layer 3 in which the gaps 4 and 13 have been formed by this laser trimming operation; the first insulator 5 is also filled into both the first gap 4 and the second gap 13, which are formed in the first conductor layer 3; and a first insulating region 6 is formed in the first gap 4 whereas a second insulating region 14 is formed in the second gap 13.

While two second conductor layers 7 and 8 are formed on this first insulator 5 in such a manner that these second conductor layers 7 and 8 are separated from each other by a preselected width, a first resistor 9 is formed on this first insulator 5 in such a manner that this first resistor 9 is connected to these two second conductor layers 7 and 8. The arranging position of this first resistor 9 constitutes such a position corresponding to an upper position of the first gap 4 which has been formed by the laser trimming on the first conductor layer 3.

In order to adjust a resistance value of the first resistor 9 which has been formed in the above-described manner, this first resistor 9 is trimmed by using a laser beam. Since this first resistor 9 is trimmed, a first trimming portion (namely, groove formed by trimming operation) 10 is formed in the first resistor 9.

A second insulator 15 having a predetermined thickness is stacked on this first insulator 5, the two second conductor layers 7 and 8, and also, the first resistor 9, and thus, this second insulator 15 is filled in the first trimming portion (groove formed by trimming operation). While two third conductor layers 16 and 17 are formed on this second insulator 15 in such a manner that these third conductor layers 16 and 17 are separated from each other by a preselected width, a second resistor 18 is formed on this second insulator 15 in such a manner that this second resistor 18 is connected to these two third conductor layers 16 and 17. The arranging position of this second resistor 18 constitutes such a position corresponding to an upper position of the first gap 13 which has been formed by the laser trimming on the first conductor layer 3.

In the multilayer electronic substrate 1 which has been formed in the above-described manner, in order to adjust an electric characteristic of this circuit, the second resistor 18 arranged on the surface of this multilayer electronic substrate is trimmed by using a laser beam. Since this second resistor 18 is trimmed, a second trimming portion (groove formed by trimming operation) 19 is formed in the multilayer electronic substrate 1.

As a consequence, in the second embodiment of the multilayer electronic substrate 1 shown in FIG. 6, the first conductor layer 3 of the first insulator 5, which corresponds to the first trimming portion 10, is removed so as to form the first gap 4. Then, the first insulator 5 is filled into this first gap 4 so as to construct the first insulating region 6, so that it is possible to avoid an adverse influence given to the first conductor layer 3 when the laser beam is irradiated. Also, the first conductor layer 3 of the second insulator 15, which corresponds to the second trimming portion 19, is removed so as to form the second gap 13. Then, the first insulator 5 is filled into this second gap 13 so as to construct the second insulating region 14, so that it is possible to avoid an adverse influence given to the first conductor layer 3 when the laser beam is irradiated.

In this embodiment, such an example is shown. That is, the multilayer electronic substrate 1 indicated in FIG. 6 is applied to the electronic circuit employed in the heat wire type airflow meter, but the present invention is not limited to this example. Apparently, the multilayer electronic substrate 1 may also be applied to other products utilizing electronic circuits. For instance, the multilayer electronic substrate 1 shown in FIG. 1 may be alternatively applied to an electronic circuit used in a pressure sensor, an electronic circuit of an engine control unit of an automobile, and the like.

Figure 7:
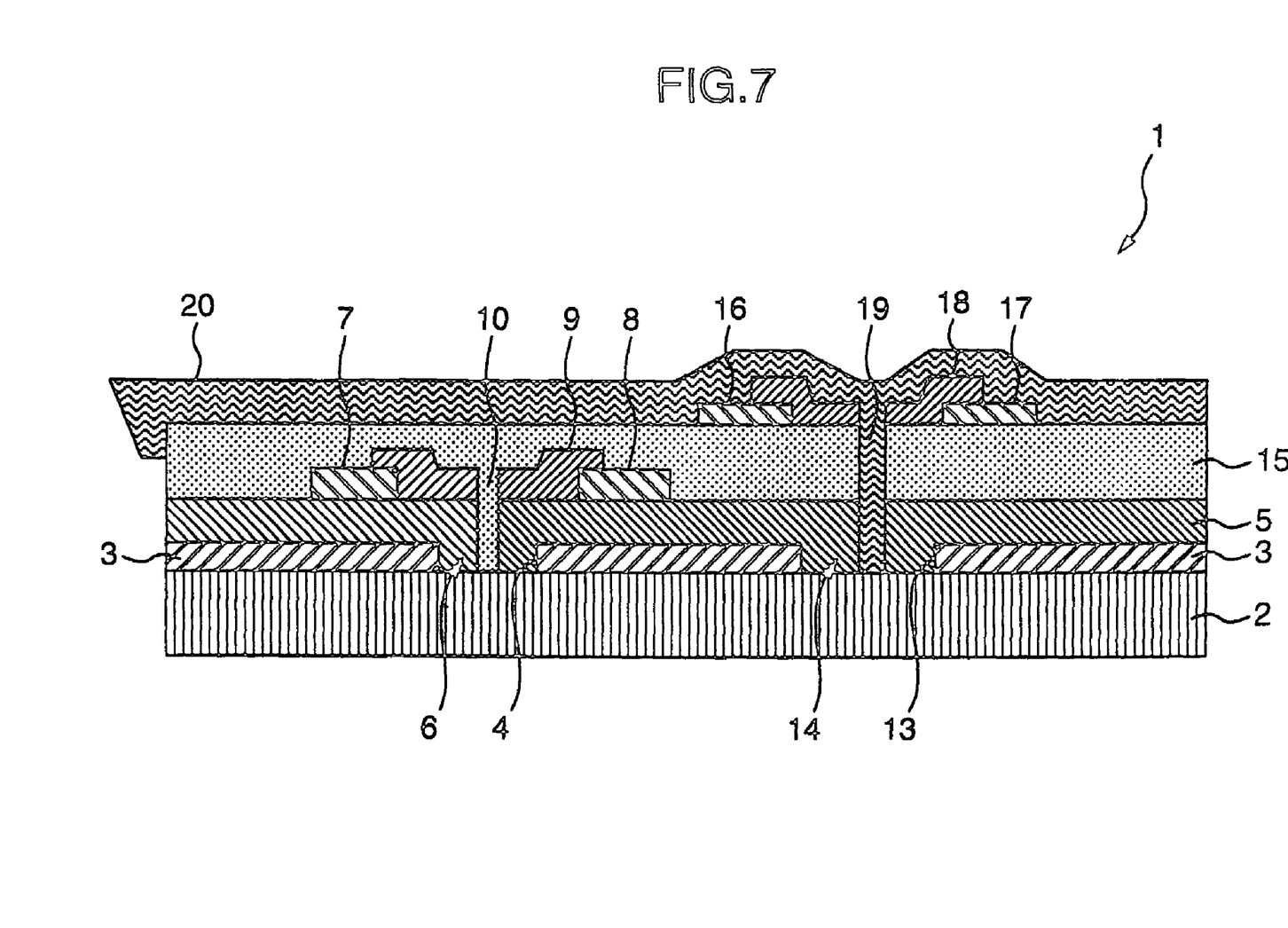
FIG. 7 is a structural sectional view of a multilayer electronic substrate which shows a fourth embodiment of the multilayer electronic substrate employed in a heat wire type airflow meter to which the present invention is applied.

FIG. 7 is a structural sectional view of a multilayer electronic substrate employed in a heat wire type airflow meter, according to a fourth embodiment of the present invention.

The fourth embodiment of the multilayer electronic substrate shown in FIG. 7 owns a technical difficult point from the third embodiment of the multilayer electronic substrate indicated in FIG. 6. That is, in the third embodiment of the multilayer electronic substrate 1 shown in FIG. 6, both the second resistor 18, and the third conductor layers 16 and 17 are formed on the second insulator 15, while these third conductor layers 16 and 17 sandwich this second resistor 18 and are arranged to be connected to this second resistor 18. Then, the second resistor 18 is trimmed so as to adjust the electric characteristic of the circuit, and the second trimming portion 19 is formed, so that the multilayer electronic substrate 1 is constituted. In contrast thereto, in the fourth embodiment of the multilayer electronic substrate shown in FIG. 7, a second resistor 18 is trimmed so as to adjust an electric characteristic of a circuit and a second trimming portion 10 is formed. Thereafter, a circuit pattern protection layer 20 is formed on a second insulator 15, a second resistor 18, and also third conductor layers 16 and 17.

As a consequence, the fourth embodiment of the manufacturing method for the multilayer electronic substrate represented in FIG. 7 may also achieve a similar effect with respect to that achieved by the third embodiment of the manufacturing method for the multilayer electronic substrate, shown in FIG. 6.

In accordance with the present invention, when the resistor is trimmed so as to adjust the electric characteristic of the circuit, there is such an effect capable of avoiding such a case that the electric conducting material of the melted resistor is reached to the under-layer conductor to cause the shortcircuit.

Also, in accordance with the present invention, the increase of the material cost and also the increase of the processing step number are not conducted, while the thickness of the circuit substrate and the weight thereof are not increased.

Furthermore, in accordance with the present invention, while the under-layer conductor is protected and the trimming steps can be easily carried out, the slim and inexpensive multilayer electronic substrate can be made in the low weight.

It should be further understood by those skilled in the art that although the foregoing description has been made on embodiments of the invention, the invention is not limited thereto and various changes and modifications may be made without departing from the spirit of the invention and the scope of the appended claims.

The following contents are disclosed in the present specification.

(1) A multilayer electronic substrate manufactured by comprising: a first conductor layer arranged on an insulating substrate; an insulator arranged on said first conductor layer; a resistor arranged on said insulator; and a second conductor layer for sandwiching said resistor to be connected to said resistor; in which said resistor is trimmed so as to adjust an electric characteristic of a circuit; wherein:

a portion of said first conductor layer, which corresponds to a trimming portion of said resistor, is constituted by an insulating region.

(2) A multilayer electronic substrate as described in (1) wherein:

said portion of the first conductor layer, which corresponds to the trimming portion of said resistor, is formed by a mask pattern printing operation when said first conductor layer is printed.

(3) A multilayer electronic substrate as described in (1) wherein:

the portion of said first conductor layer, which corresponds to the trimming portion of said resistor, is formed by a trimming operation after said first conductor layer has been printed in a solid manner.

(4) A multilayer electronic substrate as described in (1), (2) or (3) wherein:

said insulating region is formed in an integral body with the insulator arranged between said first conductor layer and said second conductor layer.

(5) A multilayer electronic substrate as described in (1), (2) or (3) wherein:

said insulating region is separately formed with reference to the insulator arranged between said first conductor layer and said second conductor layer, and is inserted to be arranged.

(6) A multilayer electronic substrate as described in (1), (2), (3), (4) or (5) wherein:

a circuit pattern protection layer is provided in such a manner that said circuit pattern protection layer covers said insulator, said second conductor layer, and said resistor.

(7) An electronic appliance containing:

a multilayer electronic substrate as a structural component, which is manufactured by comprising:

a first conductor layer arranged by providing an insulating region on an insulating substrate;

an insulator arranged by embedding said insulating region on said first conductor layer; and a resistor arranged on said insulator, and a second conductor layer for sandwiching said resistor to be connected to said resistor; and in which said resistor is trimmed so as to adjust an electric characteristic of a circuit.

(8) An electronic appliance as described in (7) wherein:

said electronic appliance containing said multilayer electronic substrate as the structural component corresponds to a heat wire type airflow meter for measuring a flow rate of air by controlling a current flowing through a heat wire.

(9) A method of manufacturing a multilayer electronic substrate, comprising:

a first step for arranging a first conductor layer on an insulating substrate;

a second step for forming a gap in said first conductor layer;

a third step for arranging an insulator on said first conductor layer and in said gap;

a fourth step for arranging a resistor on said insulator, and a second conductor layer which sandwiches said resistor and is connected to said resistor; and a fifth step for trimming said resistor so as to adjust an electric characteristic of a circuit and to form a trimming portion.

(10) A manufacturing method of a multilayer electronic substrate as described in (9) wherein:

the gap of said second step is formed by a mask pattern printing operation when said first conductor layer is printed in said first step.

(11). A manufacturing method of a multilayer electronic substrate as described in (9) wherein:

the gap of said second step is formed by a trimming operation after said first conductor layer has been printed in a solid manner in said first step.

(12) A manufacturing method of a multilayer electronic substrate as described in (9), (10) or (11) wherein:

after said fifth step for trimming said resistor so as to adjust the electric characteristic of the circuit and to form the trimming portion, a sixth step is provided in which a circuit pattern protection layer is arranged on said first insulator, said resistor, and said second conductor layer.

(13) A multilayer electronic substrate manufactured by comprising: a first conductor layer arranged on an insulating substrate; a first insulator arranged on said first conductor layer; a first resistor arranged on said first insulator; a second conductor layer for sandwiching said first resistor to be connected to said first resistor;

a second insulator arranged on said first insulator, said first resistor, and said second conductor;

a second resistor arranged on said second insulator, and a third conductor for sandwiching said second resistor to be connected to said second resistor; and a circuit pattern protection layer arranged on said second insulator, said third conductor, and said second resistor; wherein:

said first resistor is trimmed so as to adjust an electric characteristic of a circuit and said second resistor is trimmed so as to adjust an electric characteristic of a circuit;

a portion of said first conductor layer, which corresponds to a first trimming portion of said first resistor, is constituted by a first insulating region; and a portion of said first conductor layer, which corresponds to a second trimming portion of said second resistor, is constituted by a second insulating region.

(14) A multilayer electronic substrate as described in (13) wherein:

both the portion of said first conductor layer, which corresponds to the first trimming portion of said first resistor, and the portion of said second conductor layer, which corresponds to the second trimming portion of said second resistor 18, are formed by a mask pattern printing operation when said first conductor layer is printed.

(15) A multilayer electronic substrate as described in (13) wherein:

both the portion of said first conductor layer, which corresponds to the first trimming portion of said first resistor, and the portion of said second conductor layer, which corresponds to the second trimming portion of said second resistor, are formed by a trimming operation after said first conductor layer has been printed in a solid printing manner.

(16) A multilayer electronic substrate as described in (13), (14) or (5) wherein:

both said first insulating region and said second insulating region are formed in an integral body with the insulator arranged between said first conductor layer and said second conductor layer.

(17) A multilayer electronic substrate as described in (13), (14) or (15) wherein:

both said first insulating region and said second insulating region are separately formed with reference to the insulator arranged between said first conductor layer and said second conductor layer.

(18) An electronic appliance containing:

a multilayer electronic substrate as a structural component, which is manufactured by comprising:

a first conductor layer arranged on an insulating substrate; a first insulator arranged on said first conductor layer; a first resistor arranged on said first insulator; a second conductor layer for sandwiching said first resistor to be connected to said first resistor;

a second insulator arranged on said first insulator, said first resistor, and said second conductor;

a second resistor arranged on said second insulator, and a third conductor for sandwiching said second resistor to be connected to said second resistor; and a circuit pattern protection layer arranged on said second insulator, said third conductor, and said second resistor; wherein:

said first resistor is trimmed so as to adjust an electric characteristic of a circuit and said second resistor is trimmed so as to adjust an electric characteristic of a circuit; and both said first resistor and said second resistor are trimmed in order to adjust an electric characteristic of a circuit.

(19) An electronic appliance as described in (18) wherein:

said electronic appliance containing said multilayer electronic substrate as the structural component corresponds to a heat wire type airflow meter for measuring a flow rate of air by controlling a current which flows though a heat wire.

(20) A method of manufacturing a multilayer electronic substrate, comprising:

a first step for arranging a first conductor layer on an insulating substrate;

a second step for forming a first gap and a second gap in the first conductor layer;

a third step for arranging a first insulator on the first conductor layer and in the first gap and the second gap;

a fourth step for arranging a first resistor on the first insulator, and a second conductor layer which sandwiches the first resistor and is connected to the first resistor;

a fifth step for trimming the first resistor so as to adjust an electric characteristic of a circuit and to form a trimming portion;

a sixth step for arranging a second insulator on the second conductor layer, a seventh step for arranging second resistor on the second insulator, and a third conductor which sandwiches the second resistor and is connected to the second resistor; and an eighth step for trimming the second resistor so as to adjust an electric characteristic of a circuit and to form a trimming portion.

(21) A method of manufacturing a multilayer electronic substrate as described in (20), wherein the second step is executed by a mask pattern printing operation when the first conductor layer is printed in the first step.

(22) A method of manufacturing a multilayer electronic substrate as described in (20), wherein the second step is executed by a trimming operation after the first conductor layer has been printed in a solid step in the first step.

(23) A method of manufacturing a multilayer electronic substrate as described in (20), (21) or (22), wherein after the eighth step for trimming the second resistor so as to adjust the electric characteristic of a circuit and to form the trimming portion, a ninth step is provided in which a circuit pattern protection layer is arranged on the first insulator, the second resistor, and the third conductor.

What is claimed is:

1. A multilayer electronic substrate comprising:
a first conductor layer and an insulating region arranged on an insulating substrate;
an insulator arranged on said first conductor layer and said insulating region;
second conductor layers arranged on said insulator; and
a resistor connected electrically between said second conductor layers;
wherein an electric characteristic of a circuit is adjusted by trimming said resistor; and
wherein said insulating region is arranged under a part of said resistor in which a trimming portion is disposed.

2. A multilayer electronic substrate as claimed in claim 1, wherein a portion of the first conductor layer which corresponds to the trimming portion is formed by a mask pattern printing operation when said first conductor layer is printed.

3. A multilayer electronic substrate as claimed in claim 1, wherein a portion of said first conductor conductor which corresponds to the trimming portion is formed by a trimming operation after said first conductor layer has been printed by solid printing.

4. A multilayer electronic substrate as claimed in claim 1, wherein said insulating region is formed as an integral body with the insulator.

5. A multilayer electronic substrate as claimed in claim 1, wherein said insulating region is separately formed from the insulator.

6. A multilayer electronic substrate as claimed in claim 1, wherein a circuit pattern protection layer covers said insulator, said second conductor layer, and said resistor.

7. A multilayer electronic substrate comprising:
a first conductor layer and an insulating region arranged on an insulating substrate;
a first insulator arranged on said first conductor layer and said insulating region;
a second conductor layer arranged on said first insulator;
a first resistor connected electrically with said second conductor layer;
a second insulator arranged on said first insulator, said first resistor, and said second conductor layer;
a second resistor arranged on said second insulator;
a third conductor layer for sandwiching said second resistor to be connected to said second resistor; and
a circuit pattern protection layer arranged on said second insulator, said third conductor layer, and said second resistor;
wherein said first resistor is trimmed so as to adjust an electric characteristic of a circuit and said second resistor is trimmed so as to adjust an electric characteristic of a circuit; and
wherein a portion of said first conductor layer, which corresponds to a first trimming portion of said first resistor, is constituted by a first insulating region; and a portion of said first conductor layer, which corresponds to a second trimming portion of said second resistor, is constituted by a second insulating region.

8. A multilayer electronic substrate as claimed in claim 7, wherein both the portion of said first conductor layer which corresponds to the first trimming portion of said first resistor and the portion of said second conductor layer which corresponds to the second trimming portion of said second resistor are formed by a mask pattern printing operation when said first conductor layer is printed.

9. A multilayer electronic substrate as claimed in claim 7, wherein both the portion of said first conductor layer which corresponds to the first trimming portion of said first resistor and the portion of said second conductor layer which corresponds to the second trimming portion of said second resistor are formed by a trimming operation after said first conductor layer has been printed by solid printing.

10. A multilayer electronic substrate as claimed in claim 7, wherein both said first insulating region and said second insulating region are formed as an integral body with at least one of the insulators.

11. A multilayer electronic substrate as claimed in claim 7, wherein both said first insulating region and said second insulating region are separately formed.

* * * * *